US012172430B2

(12) United States Patent
Mathia et al.

(10) Patent No.: US 12,172,430 B2
(45) Date of Patent: Dec. 24, 2024

(54) SUBSTRATE POSITIONING FOR DEPOSITION MACHINE

(71) Applicant: Kateeva, Inc., Newark, CA (US)

(72) Inventors: Karl Mathia, Menlo Park, CA (US); Jesse Lu, Milpitas, CA (US); Jerry Chang, Cupertino, CA (US); Matt Audet, Campbell, CA (US); Stephen Baca, Livermore, CA (US); Vadim Mashevsky, Palo Alto, CA (US); David C. Darrow, Pleasanton, CA (US)

(73) Assignee: Kateeva, Inc., Newark, CA (US)

( * ) Notice: Subject to any disclaimer, the term of this patent is extended or adjusted under 35 U.S.C. 154(b) by 0 days.

(21) Appl. No.: 18/314,503

(22) Filed: May 9, 2023

(65) Prior Publication Data

US 2023/0347667 A1 Nov. 2, 2023

Related U.S. Application Data

(62) Division of application No. 16/915,614, filed on Jun. 29, 2020, now Pat. No. 11,679,602.

(60) Provisional application No. 62/872,501, filed on Jul. 10, 2019.

(51) Int. Cl.
| | |
|---|---|
| *B41J 11/42* | (2006.01) |
| *B41J 3/28* | (2006.01) |
| *B41J 3/407* | (2006.01) |
| *B41J 11/00* | (2006.01) |
| *H05K 3/12* | (2006.01) |

(52) U.S. Cl.
CPC ............... *B41J 11/42* (2013.01); *B41J 3/28* (2013.01); *B41J 3/407* (2013.01); *B41J 11/00* (2013.01); *B41J 11/009* (2013.01); *H05K 3/1241* (2013.01); *H05K 3/125* (2013.01); *B41J 2202/09* (2013.01)

(58) Field of Classification Search
CPC .................................. B41J 3/28; B41J 3/407
See application file for complete search history.

(56) References Cited

U.S. PATENT DOCUMENTS

| | | |
|---|---|---|
| 6,677,975 B1 | 1/2004 | Kerr |
| 7,127,159 B2 | 10/2006 | Gladnick et al. |
| 8,865,252 B2 | 10/2014 | Choi et al. |
| 9,453,282 B2 | 9/2016 | Hong et al. |
| 11,679,602 B2 | 6/2023 | Mathia et al. |

(Continued)

FOREIGN PATENT DOCUMENTS

| | | |
|---|---|---|
| EP | 1464507 A1 | 10/2004 |
| JP | 2001338867 A | 12/2001 |

(Continued)

OTHER PUBLICATIONS

Extended Supplementary Search Report issued Jun. 16, 2023 in EP Patent Application No. 20837416.5.
Final Office Action dated Oct. 20, 2022 for U.S. Appl. No. 16/915,614.
Chapman, "Strobing Machine Vision Lighting," https://www.prophotonix.com/blog/strobing-machine-vision-lighting/, May 25, 2017.

(Continued)

*Primary Examiner* — Sharon Polk
(74) *Attorney, Agent, or Firm* — Hauptman Ham, LLP

(57) ABSTRACT

A deposition device is described. The deposition device has a substrate support and a laser imaging system disposed to image a portion of a substrate positioned on the substrate support. The laser imaging system comprises a laser source and an imaging unit, and is coupled to a deposition assembly disposed across the substrate support.

18 Claims, 6 Drawing Sheets

(56) References Cited

U.S. PATENT DOCUMENTS

| | | |
|---|---|---|
| 2003/0079635 A1 | 5/2003 | Murray |
| 2003/0155513 A1 | 8/2003 | Remillard |
| 2003/0234858 A1 | 12/2003 | Kerr |
| 2005/0158668 A1 | 7/2005 | Bittner et al. |
| 2005/0235913 A1 | 10/2005 | Prentice |
| 2011/0117681 A1 | 5/2011 | Bardos et al. |
| 2012/0051984 A1 | 3/2012 | Dudenhoefer et al. |
| 2014/0265046 A1 | 9/2014 | Burris et al. |
| 2017/0139328 A1 | 5/2017 | Shibazaki |
| 2018/0009000 A1* | 1/2018 | Shang .................. B25J 9/1664 |
| 2018/0015502 A1 | 1/2018 | Zenou |

FOREIGN PATENT DOCUMENTS

| | | | |
|---|---|---|---|
| JP | 2008135562 A | | 6/2008 |
| KR | 20150077596 A | | 7/2015 |
| WO | 2007098935 A2 | | 9/2007 |
| WO | 2014200642 A1 | | 12/2014 |
| WO | 2016067144 A1 | | 5/2016 |

OTHER PUBLICATIONS

International Search Report and Written Opinion issued Mar. 2, 2022 from International Patent Application No. PCT/US2021/072006.
International Search Report and Written Opinion issued Oct. 29, 2020 from International Patent Application No. PCT/US2020/040044.
Restriction Requirement dated Dec. 30, 2022 for U.S. Appl. No. 17/451,561.
Non-final Office Action dated Feb. 10, 2023 for U.S. Appl. No. 17/451,561.
Non-final Office Action issued Apr. 20, 2022 for U.S. Appl. No. 16/915,614.
JP Office Action dated Apr. 15, 2024 for JP Patent Application No. 2022-501114.
Notice of Allowance dated Feb. 10, 2023 for U.S. Appl. No. 16/915,614.
Notice of Allowance dated Jun. 13, 2023 for U.S. Appl. No. 17/451,561.
Non-Final Office Action issued May 7, 2024 in JP Patent Application 2023-528552.

* cited by examiner

SUBSTRATE POSITIONING FOR DEPOSITION MACHINE

CROSS-REFERENCE TO RELATED APPLICATIONS

This application is a divisional application of U.S. patent application Ser. No. 16/915,614, filed Jun. 29, 2020, which claims benefit of U.S. Provisional Patent Application Ser. No. 62/872,501 filed Jul. 10, 2019, each of which is incorporated herein by reference in its entirety.

FIELD

Embodiments of the present invention generally relate to deposition devices. Specifically, deposition devices having an attached but movable service platform are described.

BACKGROUND

Deposition by Inkjet deposition is common, both in office and home printers and in industrial scale printers used for fabricating displays, deposition of large scale written materials, adding material to manufactured articles such as printed circuit boards, and constructing biological articles such as tissues. Most commercial and industrial inkjet deposition machines, and some consumer printers, use dispensers to apply material to a substrate. The dispenser ejects a controlled quantity of deposition material toward a substrate at a controlled time and rate so that the deposition material arrives at the substrate in a target location and makes a mark having a desired size and shape.

In some cases, such as in the display fabrication industries, very high precision deposition is achieved by depositing very small volumes of material at very precise locations. The volumes may have dimension of 10 µm in some cases and may be deposited in an area of dimension 15 µm. To achieve such precision in placement of materials on a substrate, the substrate must be positioned precisely and/or the position of the substrate must be known precisely. Vision systems using cameras are routinely used to photograph a substrate and determine its position precisely, but capturing the images and processing the images is time consuming. There is a need for a better way to precisely determine the position of a substrate for inkjet printing.

SUMMARY

Embodiments described herein provide a deposition device, comprising a substrate support; and a deposition assembly comprising a laser imaging system disposed across the substrate support.

Other embodiments described herein provide a method of imaging a feature on a substrate, comprising scanning the substrate relative to a laser imaging system comprising a laser source and an imaging unit; activating the imaging unit before an extremity of the feature reaches an illumination field of the laser source; activating the laser source when a portion of the feature reaches the illumination field; deactivating the laser source after an active time; and deactivating the imaging source after an imaging time, wherein the imaging time encompasses the active time.

Other embodiments described herein provide a deposition device, comprising a substrate support; and a deposition assembly comprising a laser imaging system disposed across the substrate support, the laser imaging system comprising a laser source fiber coupled to an optical assembly to direct laser radiation from the laser source toward the substrate support; and an imaging unit disposed to capture laser radiation reflected through the optical assembly.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
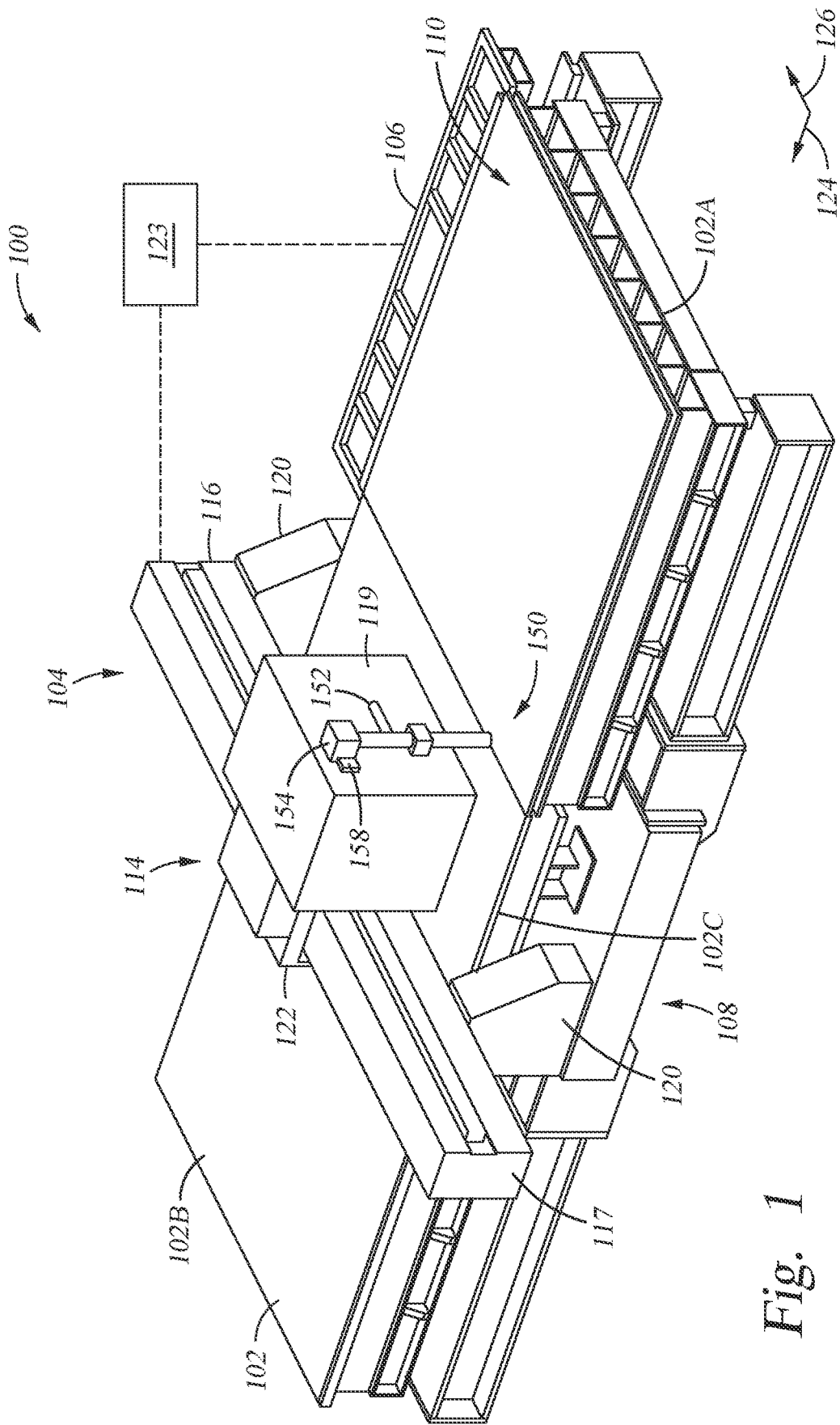
FIG. 1 is an isometric top view of a deposition device according to one embodiment.

A deposition device is described herein with a service platform that can be deployed above the work surface of the deposition device and stowed adjacent to an end of the work surface at an elevation at least partially below a basis elevation of the work surface to allow for substrate loading and unloading. FIG. 1 is an isometric top view of a deposition device 100 according to one embodiment. The deposition device 100 has a substrate support 102, a deposition assembly 104, and a holder assembly 106 for manipulating a substrate for deposition. The deposition device 100 includes a base 108, which is typically a massive object to minimize vibratory transmissions to the operative parts of the deposition device 100. In one example, the base 108 is a granite block. The deposition assembly 104 includes a deposition assembly support 116 comprising a stand 120 on each side of the base 108 and a rail or beam 117 extending between the stands 120 across the substrate support 102.

The substrate support 102 has a first section 102A, a second section 102B, and a third section 102C between the first and second section 102A and 102B. The first and second sections 102A and 102B are staging areas for substrates entering and leaving the deposition device 100, while the third section 102C is a work section for positioning the substrate for processing relative to the deposition assembly support 116. The substrate support 102 has a work surface 110 along with means for making the work surface 110 substantially frictionless. Here, the work surface 110 is a gas cushion table that provides a gas cushion, for example air, oxygen depleted air, dry air, nitrogen, or other suitable gas on which the substrate floats. The work surface 110 features a plurality of holes (not shown) that allow jets of gas to exit, thus providing an upward force to maintain a substrate at a desired elevation above the work surface 110. Some of the holes may also allow controlled withdrawal of gas from the gas cushion floating the substrate support to provide precise local control of substrate elevation. In one embodiment, the third section 102C has gas providing holes and gas withdrawing holes. The gas providing and withdrawing holes provide independent control of gas in the gas cushion and therefore substrate float height above the substrate work surface 110.

The deposition assembly 104 comprises a dispenser assembly 114 coupled to the beam 117. The dispenser assembly 114 includes a dispenser housing 119 coupled to a deposition carriage 122 that rides along the beam 117 to position the dispenser assembly 114 in relation to a substrate disposed on the third section 102C of the substrate support 102. The dispenser housing 119 contains one or more dispensers (not shown) that eject volumes of deposition material onto a substrate positioned on the substrate support 102 under the deposition assembly 104.

A substrate is positioned under the deposition assembly 104 by the holder assembly 106. The holder assembly 106 acquires secure contact with the substrate upon loading and moves the substrate along the substrate support 102 to position the substrate with respect to the deposition assembly 104 for dispensing print material onto the substrate in a precise fashion. The holder assembly 106, in this case, generally extends along the substrate support 102 in a first direction to translate the substrate in the first direction during deposition. The first direction is denoted in FIG. 1 by arrow 124. The dispenser assembly 114 generally moves in a second direction substantially perpendicular to the first direction, as defined by the beam 117, which extends substantially in the second direction, denoted in FIG. 1 by arrow 126. The second direction 126 is sometimes referred to as the "x direction," and the beam 117 as the "x beam."

A controller 132 is operatively coupled to the holder assembly 106 and the deposition assembly 104 to control movement of, and deposition onto, a substrate positioned on the substrate support. The controller 132 may directly control actuators of the holder assembly 106 and the deposition assembly 104, or the controller 132 may be operatively coupled to a holder assembly controller coupled to the holder assembly 106 and to a deposition assembly controller coupled to the deposition assembly 104. The controller 132 controls movement and positioning of the substrate, if any, on the substrate support 102. The controller 132 also controls movement of the dispenser assembly 114 along the beam 117 and ejection of deposition material from the dispenser assembly 114 onto the substrate.

A laser imaging system 150 is coupled to the dispenser assembly 114. The laser imaging system 150 includes a laser source 152 and an imaging unit 154. The laser source 152 directs laser radiation toward a substrate positioned on the substrate support 102 positioned under the dispenser assembly 114. The imaging unit 154 detects laser radiation reflected from the substrate. The imaging unit 154 can include a digital camera or other high precision imaging capture component. The imaging unit also include optics for focusing the radiation into the image capture component. The laser source 152 and imaging unit are arranged such that the laser source 152 provides an illumination field on the substrate that is within the imaging field of the imaging unit 154.

The laser source 152 may emit laser radiation that is selected to minimize impacts on other aspects of the deposition device 100 and the processes performed by the deposition device 100. For example, in many cases, curable materials are deposited on a substrate using the deposition device 100. Such materials are routinely curable using short-wavelength electromagnetic radiation, such as ultraviolet radiation. These materials are also, frequency, sensitive to short-wavelength visible radiation, and can have minor sensitivity to longer-wavelength visible radiation. Because uniform processing can be important to achieving the high precision results in industries such as the display fabrication industry, the laser source can be selected to emit long wavelength radiation to minimize any impact on deposition materials. Laser sources having emission wavelengths of 650 nm or more are useful in this regard. In one example, the laser source has emission wavelength of 650 nm. In another example the laser source has emission wavelength of 800 nm. The laser source can be a laser diode, or collection of laser diodes such as a laser diode bar. The combination of laser source and image capture component can also be selected to maximize sensitivity of the image capture component to the radiation emitted by the laser source. For example, a Dalsa Nano M2020 camera has near-peak sensitivity at a wavelength of 650 nm. Silicon-based NIR image capture units typically have peak sensitivity around 800 nm.

The laser source 152 is, in this case, fiber coupled to translate the laser emission to an emission plane that can be located close to the substrate. The divergence of the laser emission can thus be managed to produce an illumination field having a desired dimension. For many display applications, a substrate has a positioning feature, such as a fiducial mark, that can be used to precisely calibrate the position of the substrate. The mark may be small, for example 1-5 mm in dimension. In some cases, the mark has a cross-shape. The fiber coupling allows the radiation emission plane to be positioned such that divergence of the radiation produces a spot that encompasses all, or a substantial part of, the view field needed to ascertain the position of a mark.

The laser imaging system 150 is configured to capture an image while the substrate and the dispenser assembly 114 move relative to one another. The relative movement can be as fast a 1 m/sec in some cases. An imaging controller 158 is operatively coupled to the laser source 152 and the image capture unit 154 to drive image capture while relative movement is underway. Here, the laser source has a pulse capability at least as short as 5 µsec, meaning that the average intensity of the emitted radiation field increases, reaching half its maximum value at a pulse start time, and decreases, reaching half its maximum value at a pulse end time, in a pulse duration, defined as the duration from the pulse start time to the pulse end time, of about 5 psec. In some cases, a laser source having a pulse capability at least as short as 1 µsec is used. The imaging controller 158 is realized in a printed circuit board containing the digital circuitry that communicates instructions to the image capture unit 154 to start and stop image capture and to the laser source 152 to switch on and switch off, or alternately to emit a pulse having a defined duration. The imaging controller 158 is operatively coupled to the controller 132, and optionally to other controllers such as holder assembly controllers and dispenser assembly controllers, to send and receive signals representing information used to control imaging of the substrate. The imaging controller 158 is configured to send signals representing images captured by the imaging capture unit 154 to the controller 132 for analysis. The imaging controller 158 is also configured to control the image capture unit 154 and the laser source 152 to capture an image when a feature of the substrate, such as positioning feature, is expected to be within the field of view of the image capture unit 154, based on information received, such as expected position of the feature and movement rate of the substrate, from the controller 132.

Figure 2:
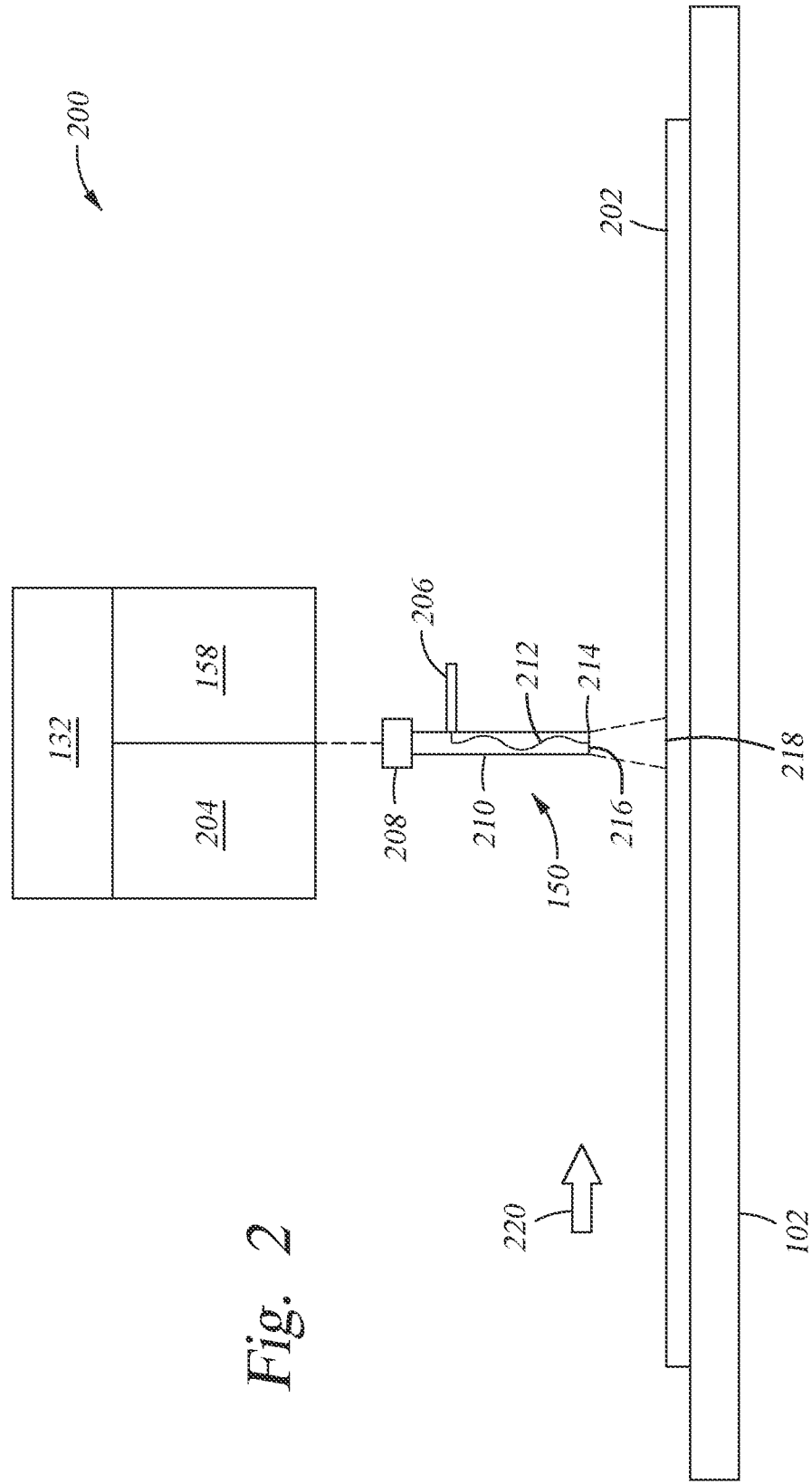
FIG. 2 is a block diagram of a position acquisition system according to one embodiment.

FIG. 2 is an elevation view of a position acquisition system 200 according to one embodiment. The position acquisition system 200 comprises the laser imaging system 150, with a substrate 202 disposed on the substrate support 102 for processing. The laser imaging system 150 is operatively coupled to the imaging controller 158, which is further operatively coupled to the system controller 132, as described above. The laser imaging system 150 may also be operatively coupled to a positioning controller 204 that can control and adjust the position of the laser imaging system 150. The positioning controller 204 may adjust the position of the laser imaging system 150 with respect to the dispensers of the dispenser housing 119 of FIG. 1.

In this case, the laser imaging system 150 includes a laser source 206 and an imaging unit 208. An optical assembly 210 optically couples the laser source 206 and the imaging unit 208 to the substrate 202 for imaging. The optical assembly may include lenses and mirror for directing a focusing light reflected from the substrate into the imaging unit 208. An optical fiber 212 translates the laser radiation emitted by the laser source 206 to an emission point 214, which may be at an end of the optical assembly 210 distal to the substrate support 102, may extend beyond the end of the optical assembly 210 to a location closer to the substrate support 102 than the end of the optical assembly 210, or may be recessed within the optical assembly 210. The optical fiber 212 is supported by a support 216 that maintains a position of the emission point 214. Laser radiation is emitted from the optical fiber 212 at the emission point 214 and traverses a gap between the emission point 214 and the substrate 202 to provide an illumination field 218. Dimension of the illumination field 218 can be controlled by controlling location of the emission point 214 with respect to the substrate 202. During processing, the substrate is typically scanned with respect to the laser imaging system 150 to illuminate portions of the substrate to be imaged, as indicated schematically by the arrow 220. The laser source 206 is activated at times when the portion of the substrate to be imaged is partially or completely within the illumination field 218 as the relative scanning is performed, and deactivated when the portion to be imaged has traversed the illumination field 218 for a time sufficient to capture the desired image of the entire area to be imaged. This may be when a first portion of the area to be imaged exits the illumination field 218, or when a last portion of the area to be imaged exits the illumination field 218.

Figure 3:
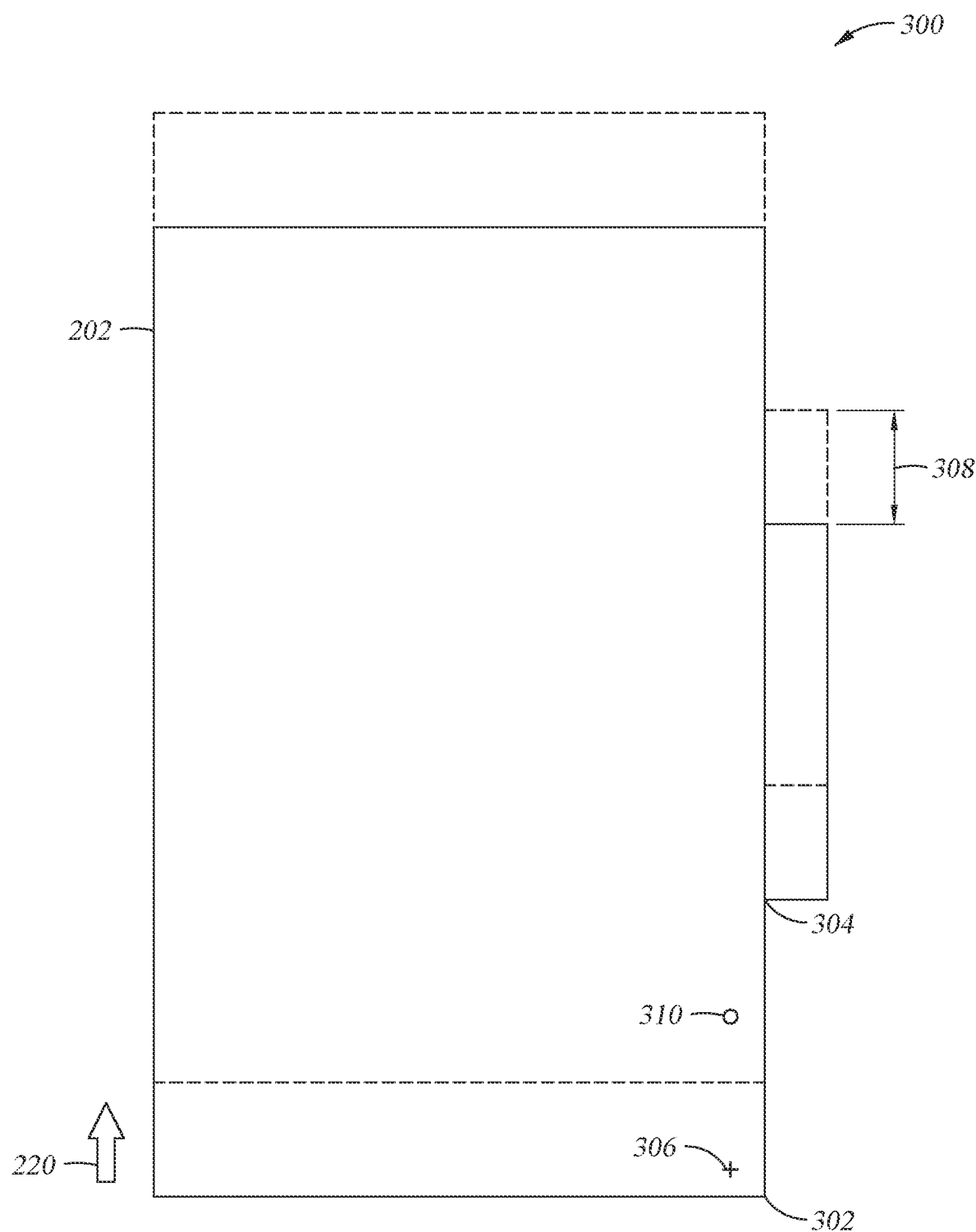
FIG. 3 is an algorithm diagram of a droplet ejection algorithm according to one embodiment.

FIG. 3 is an algorithm diagram of an image capture control algorithm 300 according to one embodiment. The image capture control algorithm 300 is used with deposition devices such as the device 100. The image capture control algorithm 300 creates triggers for initiating image capture of a feature on a substrate 301 by an image capture unit and for initiating illumination by an illumination unit. The illumination unit may be a laser, but is, in any event, capable of generating short pulses of radiation within an illumination field. The duration of the pulses is around 1 µsec, or shorter, to enable capturing images of a small feature on a substrate at relative rates of motion of up to 1 m/sec.

The algorithm 300 uses a position markers, along with position signals from the substrate holder to determine when to begin image capture by the image capture unit and when to begin illumination by the laser source. Generally the algorithm uses a defined coordinate system that is used by the controller to perform the algorithm 300. The substrate has a defined origin point 302, which is positioned at a known position ($x_S$, $y_S$) relative to a home position 304 of the holder ($x_H$, $y_H$), which is also known. A design location 306 of a feature on the substrate ($x_F$, $y_F$) is known relative to the origin point 302 of the substrate. In an embodiment where the substrate is moved in the y-direction during processing, the y-position of the holder, substrate origin, and feature are $y_h$, $y_s$, and $y_f$, respectively. These are offset from their various home positions in the y-direction by an identical distance 308. If the laser imaging system is moved during processing, the position of the illumination field 310 at any time is $y_i$. The feature has design dimension of $\Delta x_F$ and $\Delta y_F$. The illumination field 310 produced by the laser imaging system has a known location ($x_I$, $y_I$) relative to the holder home position. The illumination field also has dimensions $\Delta x_I$ and $\Delta y_I$. Thus, in the y-direction, the illumination field extends from $$y_I - \frac{1}{2}\Delta y_I \text{ to } y_I + \frac{1}{2}\Delta y_I,$$

or if the laser imaging system is moved, $$y_i - \frac{1}{2}\Delta y_I \text{ to } y_i + \frac{1}{2}\Delta y_I.$$

At any time during a process, the holder y-position $y_h$ is known from actuator position.

The various position markers are provided to a controller, such as the controller 132. The algorithm determines when to activate the image capture unit and the laser source to capture an image of the feature, based on the expected location of the feature. The size of the illumination field is set to provide sufficient coverage that any offset between the expected position of the feature and the actual position of the feature is less than an amount that keeps the entirety of the feature in the illumination field during the exposure.

Let relative movement velocity of the substrate and the laser imaging system in the y-direction be v, and let pulse duration be t. The algorithm computes a light-on event to illuminate the feature 306. The light-on event may be computed when the entire feature 306 is within the illumination field 310. This occurs when, in the y-direction, $$y_f - \frac{1}{2}\Delta y_F = y_i - \frac{1}{2}\Delta y_I.$$

If the holder position is offset in the y-direction relative to the substrate origin by $y_{Hs}$ then the holder position at light-on time is $$y_i - \frac{1}{2}\Delta y_I - y_f + \frac{1}{2}\Delta y_F + y_S + y_{HS}.$$

The light-on event can be computed in terms of holder position, time, or any other parameter that can be determined from the parameters of the deposition job. If the light-on event is render as a time, it will be the time at which $$vt = y_i - \frac{1}{2}\Delta y_I - y_f + \frac{1}{2}\Delta y_F.$$

The duration light is on is minimized to avoid distortion of the image. The substrate and the laser imaging system may be relatively moving when the image is captured. Illuminating the scene longer than necessary to capture the desired image could result in reduction in the clarity of the image. The algorithm computes a light-off event when, after the light-on event, the feature has traversed the illumination field. This occurs when, in the y-direction $$y_f + \frac{1}{2}\Delta y_F = y_i + \frac{1}{2}\Delta y_I.$$

The algorithm 300 can compute light-off holder position as $$y_i + \frac{1}{2}\Delta y_I - y_f - \frac{1}{2}\Delta y_F + y_S + y_{HS}$$

or the time at which $$vt = y_i + \frac{1}{2}\Delta y_I - y_f - \frac{1}{2}\Delta y_F.$$

The duration of the pulse is selected to be the time for the feature to transit the illumination field, which is $$t = \frac{1}{v}(\Delta y_I - \Delta y_F).$$

The laser imaging system is positioned such that the x-position of the illumination field is the same as the designed x-position of the feature.

Figure 4:
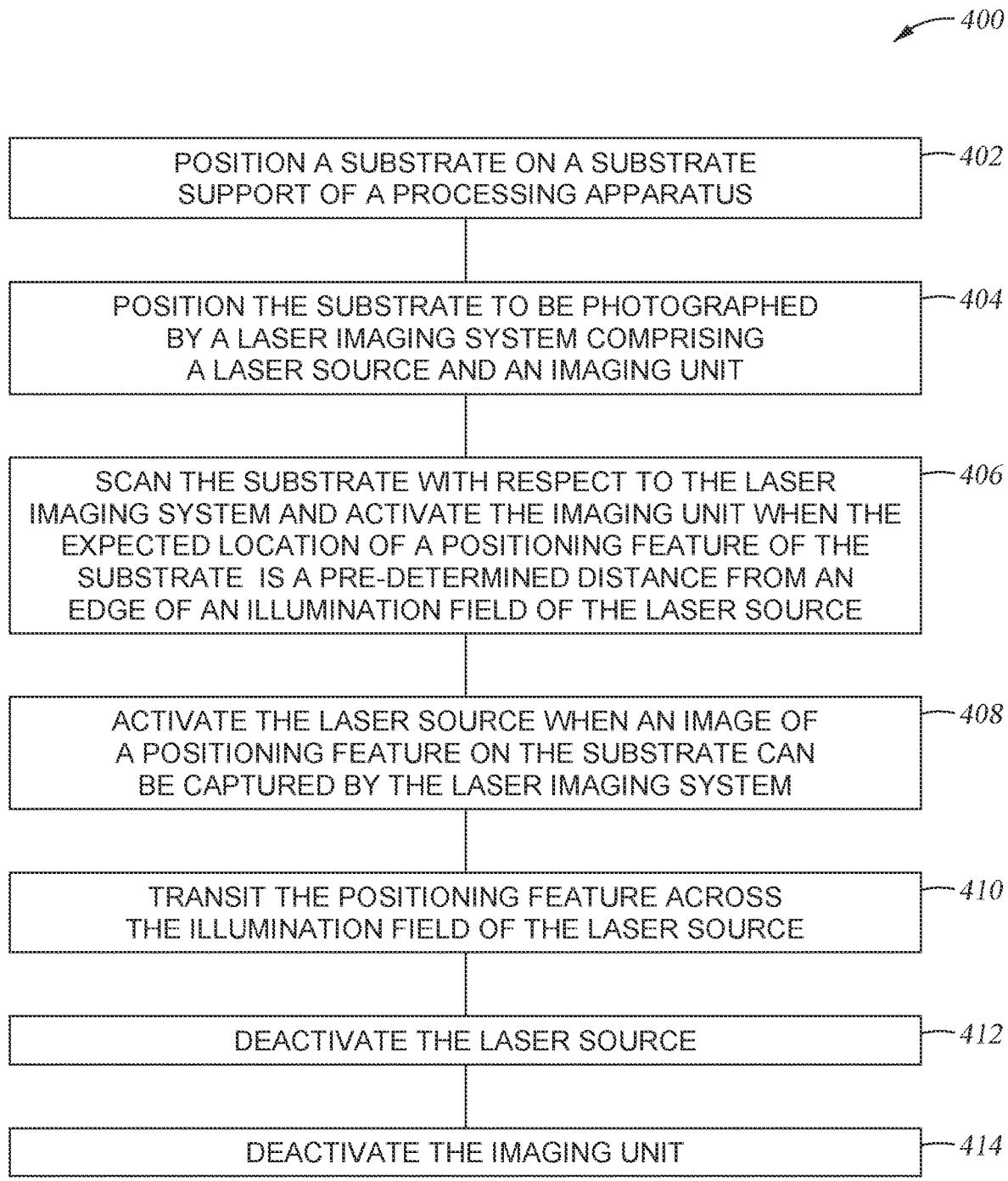
FIG. 4 is a flow diagram of a method according to one embodiment.

FIG. 4 is a flow diagram summarizing a method 400 of capturing an image of a position feature on a substrate. At 402, a substrate is positioned on a substrate support of a processing apparatus. Typically the processing apparatus is used to perform a process, such as material addition to, or removal from, the substrate, and positioning features of the substrate are used to guide the process. The position feature may be a special feature, such as a mark or structure, added to the substrate specifically for positioning the substrate, or the position feature may be a feature added to the substrate for some other purpose and used here for positioning the substrate.

At 404, the substrate is positioned to be photographed by a laser imaging system. The substrate can be moved into position with respect to the laser imaging system by applying a substrate holder to move the substrate. In some cases, the substrate support includes a frictionless surface such that the substrate holder can move the substrate with little resistance. The laser imaging system can also be moved in some cases. For example, the laser imaging system may be deployed on a positioning system using an air bearing coupled to a rail. The laser imaging system includes a laser source oriented to direct laser radiation toward an imaging area. An imaging unit is positioned proximate to the laser source to image laser radiation reflected from the substrate.

The substrate is positioned for imaging at a location determined by an expected location of the positioning feature. The expected location of the positioning feature is a pre-determined location on the substrate where the positioning feature is expected to be found. The laser imaging system and the substrate are mutually positioned such that the expected location is near an illumination field of the laser source.

At 406, the substrate is scanned with respect to the laser imaging system. The expected location of the positioning feature is moved toward an edge of the illumination field of the laser source. When the expected location is at a pre-determined distance from the edge of the illumination field, the imaging unit is activated to begin acquiring image data. At this time, the laser source is not active. Typically, the processing apparatus has an enclosure that isolates the substrate support and laser imaging system, so any light source other than the laser source is minimal.

At 408, the laser source is activated when an image of the positioning feature can be captured by the imaging unit. The laser source may be activated when a portion of the positioning feature is expected to enter the illumination zone, when a fraction of the positioning feature inside the illumination field of the laser source is expected to be at a maximum, or when the entire positioning feature is initially expected to be within the illumination field of the laser source. In one case, the laser source is activated when a leading edge of the positioning feature is expected to reach an edge of the illumination field. The expected position of the positioning feature may be at an extremity of the positioning feature, or at a center of the positioning feature. If the expected position of the positioning feature is at an extremity thereof, the laser source can be activated when the expected position of the positioning feature is expected to reach the edge of the illumination field. If the expected position of the positioning feature is at a center thereof, a known dimension of the positioning feature can be used to determine an expected position of an extremity of the positioning feature, and the laser source can be activated when the expected position of the extremity of the positioning feature is expected to reach the edge of the illumination zone.

In other cases, the laser source can be activated when the positioning feature, or a large portion thereof, is expected to be entirely within the illumination field of the laser source. In this case, the laser source is activated when a trailing edge of the positioning feature is expected to reach the edge of the illumination zone, as determined by the known geometry and expected location of the positioning feature. Waiting until a maximum portion, or all, of the positioning feature is within the illumination field of the laser source to activate the laser source minimizes exposure time for capturing the image, and therefore minimizes movement of the substrate during image capture. Minimizing movement of the substrate during image capture results in the sharpest image.

At 410, the substrate and laser imaging system are mutually scanned such that the positioning feature, or a portion thereof, transits the illumination field of the laser source during a transit time. The transit time may be defined in a number of ways. In one case, the transit time is a time between when a first extremity of the positioning feature enters the illumination field of the laser source and the last extremity of the positioning feature exits the illumination field of the laser source. In another case, the transit time is a time between when a last extremity of the positioning feature enters the illumination field, wherein the positioning feature has no other extremities that enter the illumination field thereafter, and a time when a first extremity of the positioning feature exits the illumination field. In either case, all or only a portion of the positioning feature may transit through the illumination field. The time during which the transit takes place may be as little as 1 μsec. The transit time can be determined using a known dimension of the illumination field and by the velocity of transit.

At 412, the laser source is deactivated. An active time of the laser source is defined as the time between when the laser source is activated and when the laser source is deactivated. The active time of the laser source may be the same as the transit time, or different. The active time of the laser source may be coincident and simultaneous with the transit time, may overlap with the transit time, or may encompass the transit time. In one case, the active time is coincident and overlapping with the transit time. In another case, the active time is coterminous and overlapping with the transit time. In yet another case, the active time is concurrent with the transit time, and can overlap with the transit time or encompass the transit time. In any event the active time and transit time are related to illuminate a desired portion of the positioning feature during the transit time.

In the event an image of the entire positioning feature is desired, but cannot be captured in a single exposure, due for example to the size of either the illumination field of the laser source or the size of the imaging field of the imaging unit, the substrate and laser imaging system can be repositioned for a second exposure to capture an additional portion of the positioning feature in a manner similar to the method 400.

At 414, the imaging unit is deactivated. An imaging time can be defined as the time between when the imaging unit is activated and when the imaging unit is deactivated. The imaging time is longer than the active time of the laser source, since obtaining short laser pulses is more straightforward than obtaining useful exposures with short exposure times. In the embodiments described herein, the positioning features may have dimension on the order of 1 μm, and scan velocity of the substrate may be as much as 1 m/sec. Thus, in some cases images are captured in a duration of 1 μsec using the methods and apparatus described herein. Such short duration exposures are more readily accomplished using a short laser active time of 1 μsec with a longer imaging time of 1 msec or more.

The method 400 may be repeated to image a plurality of positioning features. In each case, an expected position of the positioning feature is known, and the substrate and laser imaging system are positioned to place the expected position near the illumination field of the laser source. It should be noted that, due to errors in placement of the substrate, errors in placement of the laser imaging system, errors in application of the positioning features to the substrate, and thermal displacements and distortions, an image taken using the expected location of the positioning feature may not capture the desired image. In such cases, the captured image can be analyzed to determine magnitude and direction of a position correction that can be applied. The method 400 can then be repeated, applying the position correction before or during performance of the method 400. Typically the expected position of the positioning feature is modified by the position correction prior to repeating the method 400, but a bias can also be applied to the position of the substrate and/or the laser imaging system in addition to, or instead of, modifying the expected position of the positioning feature.

Figure 5:
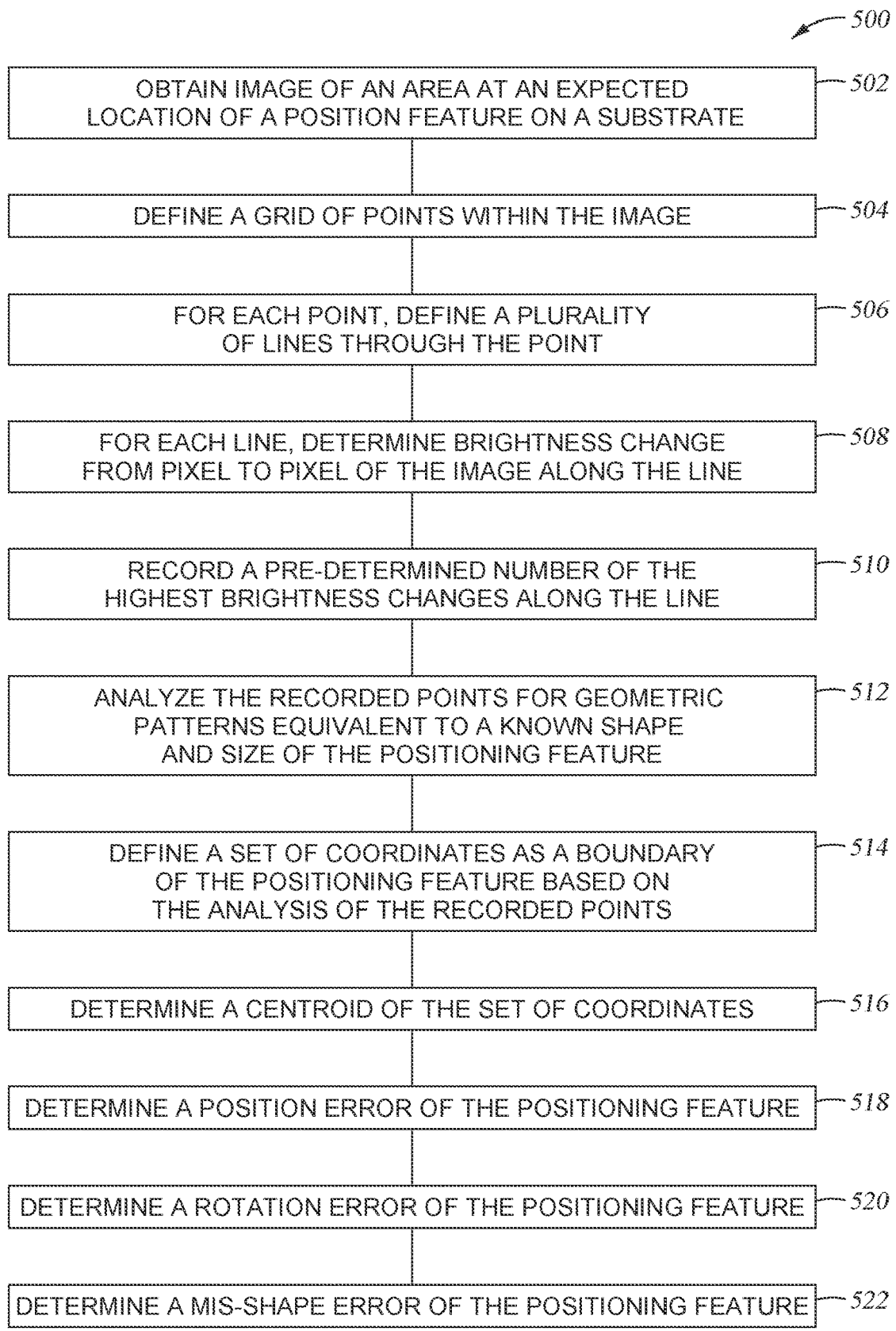
FIG. 5 is a flow diagram summarizing a method that can be used with the apparatus and other methods described herein.

FIG. 5 is a flow diagram summarizing a method 500 that can be used with the apparatus and other methods described herein. The method 500 is a method of determining position and orientation of a positioning feature of a substrate from a laser-illuminated image. At 502, an image of an area of a substrate is obtained at a location where a positioning feature is expected to be found. The image is obtained using the laser imaging system described herein.

At 504, a set of grid points is defined within the image. The grid points are defined by x-y coordinates in a common coordinate system with points in the image. That is, the image is taken by locating the imaging system at a point defined by coordinates. The geometry of the imaging system determines the coordinates of the boundaries of the image in the coordinate system. The grid points are defined between the coordinates of the boundaries of the image. Any number of grid points may be used, with more grid points being helpful when the positioning feature has a more complex shape.

The expected shape and size of the positioning feature is typically also defined by coordinates in the same coordinate system. For example, vertices of a polygonal positioning feature can be defined by an ordered set of coordinate pairs, where adjacent coordinate pairs define the locations of vertices connected by edges. For non-polygonal shapes having curved contours, the coordinates may define adjacent points on edge contours of the shape. More points in the shape definition of such a shape improve the shape definition by minimizing the error of assumed straight edges between neighboring points.

At 506, for each grid point defined at 504, a plurality of lines is defined through the grid point. The lines can be defined as a set of coordinate pairs representing each pixel of the image along the lines, or the lines can be defined as a set of end points. The number of lines is pre-determined based on the complexity of the shape being imaged, and may be increased if a first performance of the method 500 yields unsatisfactory definition of the positioning feature in the image. The lines are generally selected to cover a plane uniformly, for example radiating at equal angles from the origin point.

At 508, for each line defined at 506, a brightness change from pixel to pixel of the image along the line is determined. For each pixel $P^1$ on the line, defined by a coordinate pair $(x_{p1}, y_{p1})$ belonging to the set of coordinate pairs defining the line, the brightness of the pixel $B_{p1}$ is ascertained. The brightness $B_{p2}$ of at least one neighboring pixel $P^2$ on the line, at coordinates $(x_{p2}, y_{p2})$ is also ascertained. The two brightnesses are subtracted, $B_{p2}-B_{p1}$ to determine brightness change at pixel $P^1$. Absolute value is typically used. This type of brightness change is "forward" brightness change. Alternately, "backward" brightness change, where $P^1$ is compared to the preceding pixel $P^0$, or "central" brightness change, where average brightness change from $P^0$ to $P^1$ to $P^2$, can be used.

Brightness change is generally used to indicate where a boundary may be located in the image. At 510, a pre-determined number of the highest brightness change pixels, points along the line having the highest magnitudes of brightness change, are recorded as candidates for a shape boundary within the image. Operations 506, defining lines, 508, analyzing brightness changes along the lines, and 510, recording the largest magnitude brightness changes, are repeated for all grid points defined for the image. From this process, a set of points is acquired representing candidate points for defining the edge of the shape captured in the image.

At 512, the recorded points are analyzed to determine which points lie on the boundary of the image of the positioning feature. Any number of shape recognition algorithms can be used to determine which points can be used to define the location of the boundary edge of the shape in the image. Selection of the algorithm can be influenced by the known shape of the positioning feature. For example, if the shape is known to be circular, or nearly so, equality of distance from a point can be used as a search criteria. For more complex shapes, distance based signatures can be computed in a matching algorithm. For example, test shapes bounded by the known shape and dimension of the positioning feature can be defined by coordinates, and distances of the recorded points from the test shape can be determined. The test shape can then be sought, within the constraints of the known shape and dimension, which minimizes the distance statistic. The result of such search can be improved by excluding statistical outliers to resolve a "best" score for each test shape, and the test shape with the best overall score can be identified as the likeliest representation of the shape in the image.

From such a best test shape, further refinement of the shape can be performed. For example, if the test shape has boundaries defined by coordinate pairs of pixels on the boundary, curvature metrics can be applied pixel by pixel to improve the test shape fit to the recorded points. At 514, a set of coordinates is defined as representing a boundary of the positioning feature in the image based on the analysis of 512.

After the boundary of the positioning feature in the image is defined in coordinates, characteristics of the positioning feature in the image can be determined. At 516, a centroid of the coordinates defining the boundary of the positioning feature can be computed as the "center" of the feature. This location can be recorded in the system as the actual location of the positioning feature on the substrate. Alternately, a maximum or minimum x-value and a maximum or minimum y-value can be used as the location of the positioning feature. When the position is defined at 516, a position error of the positioning feature can be determined at 518. The position error is the difference between the coordinates of the positioning feature as defined from the image analysis and the expected coordinates of the positioning feature. This position error can be used to adjust processing plans for the substrate.

At 520, a rotation error can be defined for the positioning feature. A rotation transformation can be applied to the coordinate set defining the boundary of the positioning feature in the image. For example, a rotation angle can be defined in radians, and an x-y shift of each pixel in the coordinate set defining the boundary of the positioning feature in the image can be defined based on radial coordinates of each pixel. After applying the rotation transformation, a difference between the rotated coordinate set of the image boundary and the expected coordinate set of the positioning feature boundary can be computed. The degree of rotation that minimizes the difference can be used as the rotation error of the image. The rotation error may be computed before or after adjusting for any position error identified at 518.

At 522, a mis-shape error can be defined for the positioning feature. The mis-shape error documents distortion of the positioning feature from its expected shape. The mis-shape error, if not detected and compensated, can drive processing errors introduced based on the assumption that the positioning feature is shaped properly. For example, if one corner of a square positioning feature is misplaced, such that the positioning feature is not quite square, the positioning feature may be found and located, but it's location may be mis-recorded for the processing system based on the mis-shape. The mis-shape error is typically determined after compensating for any position error and rotation error. A pixel-by-pixel error of the position- and rotation-compensated image can be computed and recorded as the mis-shape error. The recorded location of the positioning feature, for purposes of processing the substrate, can be adjusted based on the identified mis-shape error.

The method 500 can be used to locate and define a plurality of positioning features of a substrate. Errors detected in a plurality of positioning features can be analyzed to identify systematic errors in placement and orientation of a substrate in the processing system. For example, similar rotation or position errors among a plurality of positioning features can indicate an overall rotation or position error in placement of the substrate. Different rotation or position errors can indicate distortion of a substrate, or misplacement of positioning features on the substrate. The method 500, and variations thereof, are performed using a digital processing system programmed with instructions appropriate to render the various coordinates and calculations referred to in the method 500. The digital processing system accepts data representing the image from the imaging unit, and automatically identifies the boundaries of the feature in the image, and optionally the position error, the rotation error and the mis-shape error of the positioning feature in the image. The results of the method 500 can be used to control precision deposition of material onto a substrate using, for example, the deposition apparatus 100 of FIG. 1.

Figure 6:
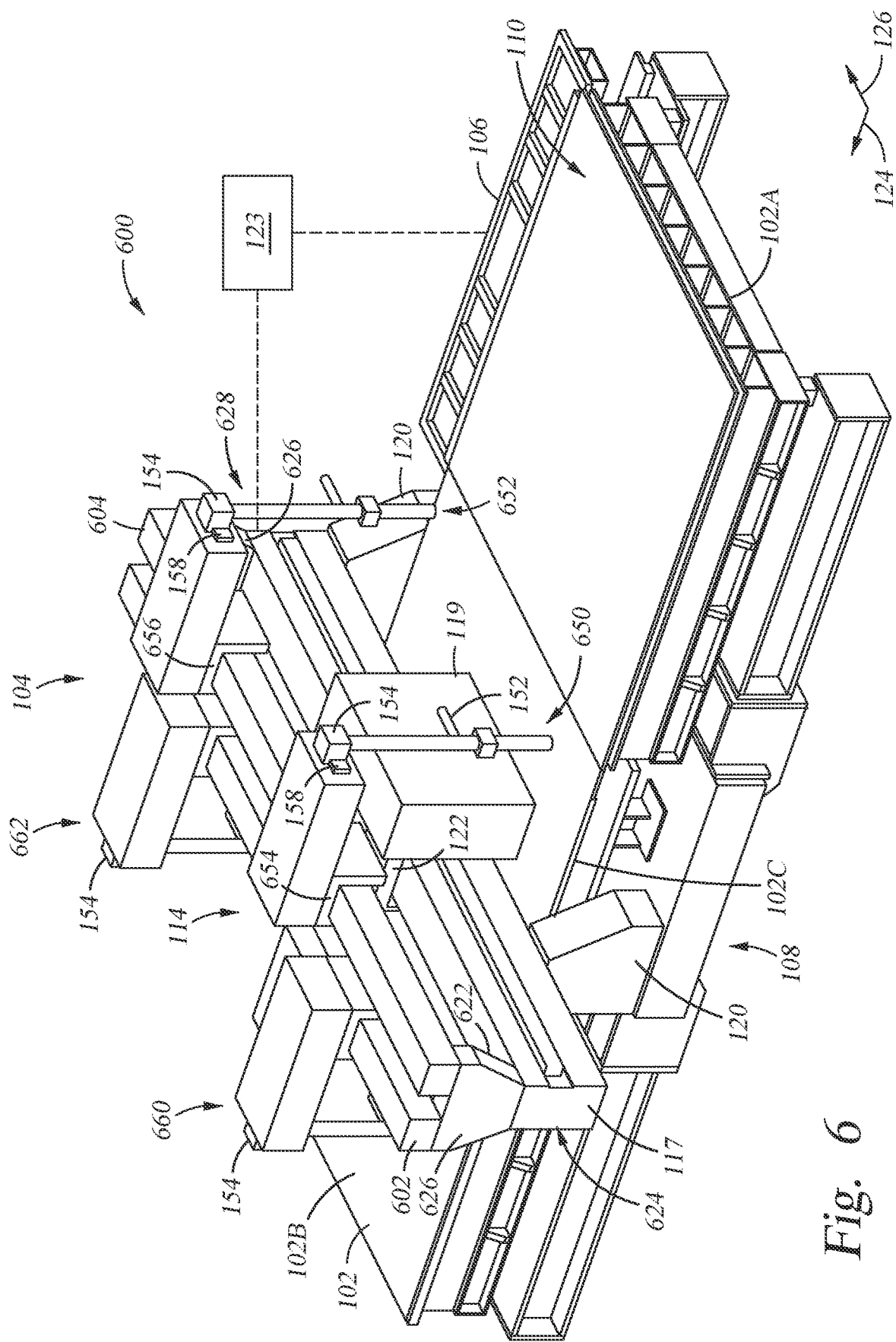
FIG. 6 is an isometric top view of a deposition device according to another embodiment.

FIG. 6 is an isometric top view of a deposition device according to another embodiment. The device of FIG. 6 is similar to the device of FIG. 1, with the difference that the laser imaging system 150 is absent. Instead, a first laser imaging system 650 is movably coupled to an imaging rail 604, which is part of a deposition assembly support 616. The deposition assembly support 616 is like the deposition assembly support 116 of FIG. 1, including the beam or rail 117, which is a deposition rail in this case. The deposition assembly support 616 include an extension 620 that supports a first imaging system 650 and a second imaging system 652. The extension 620 comprises a first riser 622 that extends from a first end 624 of the deposition rail 117 and a second riser 626 that extends from a second end 628 of the deposition rail 117 opposite from the first end 624. The extension 620 further comprises the imaging rail 604, which extends from the first riser 622 to the second riser 624, substantially parallel to the deposition rail 117.

Each of the first imaging system 650 and the second imaging system 652 is substantially the same as the imaging system 150. The first imaging system 650 is coupled to the imaging rail 604 by a first imaging carriage 654. The second imaging system 652 is coupled to the imaging rail 604 by a second imaging carriage 656. The dispenser housing 119 is between the first imaging system 650 and the second imaging system 652. Each of the first imaging carriage 654 and the second imaging carriage 656 has a lateral extension that supports the first and second imaging systems 650 and 652 at a clearance from the imaging rail 604. The clearance allows each of the first and second imaging systems 650 and 652 to move along substantially the entire length of the imaging rail 604, with no interference from the deposition housing 119.

The device 600 has four independently movable imaging systems. The two imaging systems 650 and 652 described above are located on a first side of the deposition support assembly 616. The device 600 has a third imaging system 660 and a fourth imaging system 662, each of which is a laser imaging system like the imaging systems 650 and 652. Here, the imaging rail 604 is a first imaging rail, and a second imaging rail 664 is part of the deposition support assembly 616. The first and second imaging rails 604 and 664, in this case, are both disposed on the two risers 622 and 626, and extend parallel, each to the other, between the two risers 622 and 626. The imaging systems 660 and 662 are each supported on the second imaging rail 664 by an imaging carriage. Specifically, a third imaging carriage 674 couples with the second imaging rail 664 to support the third imaging system 660, and a fourth imaging carriage 676 couples with the second imaging rail 664 to support the fourth imaging system 662. A space between the imaging rails 604 and 664 allows the first and second carriages 654 and 656 to move along the first imaging rail 604 without interference from the third and fourth carriages 674 and 676. In this way, all four imaging systems can be positioned along substantially the entire length of the deposition support assembly 616. Use of multiple imaging systems allows for a high volume of images to be captured in a smaller time, thus speeding up processes that depend on such imaging.

Any number of the laser imaging systems described herein can be used with such a device. In FIG. 6, four imaging systems are illustrated, but any number of such imaging systems can be used. For example, two imaging systems can be used on one of the two imaging rails, or two imaging systems can be used, one on each imaging rail. Imaging systems can be added to one or both imaging rails by merely placing the carriage of an imaging system on the desired imaging rail. In some cases, the carriages couple to the imaging rails using air bearings, so the air bearing of the added imaging system can be activated to allow the added imaging system to move along the chosen imaging rail. Deploying a plurality of laser imaging systems allows a device to use the imaging precision of laser radiation to image a plurality of locations simultaneously, thus increasing the speed of imaging various portions of a substrate. Using multiple imaging devices can also increase precision of imaging at a single location on the substrate if two or more images of the location are acquired and compared.

While the foregoing is directed to embodiments of the present invention, other and further embodiments of the present disclosure may be devised without departing from the basic scope thereof, and the scope thereof is determined by the claims that follow.

What is claimed is:

1. A method of imaging a feature on a substrate, comprising:
    relatively scanning a substrate and a laser imaging system comprising a laser source and an imaging unit, wherein the imaging unit is a camera having sensitivity matched to an emission wavelength of the laser;
    activating the imaging unit before an extremity of a feature of the substrate to be imaged reaches an illumination field of the laser source;
    activating the laser source when a portion of the feature reaches the illumination field;
    deactivating the laser source after an active time of less than 5 μsec; and
    deactivating the imaging source after an imaging time, wherein the imaging time encompasses the active time.

2. The method of claim 1, further comprising relatively positioning the substrate and the laser imaging system based on an expected location of the feature.

3. The method of claim 2, further comprising automatically identifying a boundary of the feature in the image.

4. The method of claim 2, further comprising automatically identifying a position error of the feature.

5. The method of claim 2, further comprising automatically identifying a rotation error of the feature.

6. The method of claim 1, wherein the laser imaging system is a first laser imaging system, and further comprising:
    capturing a first image of the feature using the first laser imaging system; and
    capturing a second image of the feature using a second laser imaging system.

7. The method of claim 6, wherein the first laser imaging system and the second laser imaging system are coupled to a support extending across a substrate support on which the substrate is disposed for imaging.

8. A method, comprising:
    relatively scanning a substrate and a laser imaging system comprising a fiber-coupled laser source and an imaging unit;
    activating the imaging unit before an extremity of a feature of the substrate to be imaged reaches an illumination field of the laser source;
    activating the laser source when a portion of the feature reaches the illumination field;
    capturing an image of the feature while the laser source is activated;
    deactivating the laser source after an active time; and
    deactivating the imaging source after an imaging time, wherein the imaging time encompasses the active time.

9. The method of claim 8, wherein the laser imaging system is coupled to a deposition assembly of a deposition device, and relatively scanning the substrate and the laser imaging system comprises moving the substrate during the active time.

10. The method of claim 8, wherein the imaging unit is a camera having sensitivity matched to the emission wavelength of the laser source.

11. The method of claim 8, further comprising automatically identifying a boundary of the feature in the image, automatically identifying a position error of the feature, automatically identifying a rotation error of the feature, or any combination thereof.

12. The method of claim 11, wherein automatically identifying a boundary of the feature in the image comprises analyzing brightness of pixels of the image.

13. The method of claim 8, further comprising determining when to activate the imaging unit and the laser source based on an expected position of the feature on the substrate and a movement rate of the substrate.

14. The method of claim 13, further comprising using a substrate holder to move the substrate and determining a movement rate of the substrate based on signals from the substrate holder.

15. The method of claim 8, wherein the image of the feature is captured while the substrate and the laser imaging system are in relative motion.

16. The method of claim 8, wherein the active time is a time during which the feature is within the illumination field.

17. A method, comprising:
    relatively scanning a substrate and a laser imaging system comprising a fiber-coupled laser source and an imaging unit;
    activating the imaging unit before an extremity of a feature of the substrate to be imaged reaches an illumination field of the laser source;
    activating the laser source when a portion of the feature reaches the illumination field;
    capturing an image of the feature while the feature is located within the illumination field;

deactivating the laser source after an active time; and
deactivating the imaging source after an imaging time,
wherein the imaging time encompasses the active time.

18. The method of claim 17, wherein the image of the feature is captured while the substrate and the laser imaging system are in relative motion.

* * * * *